US012784825B2

(12) United States Patent
Chinthu et al.

(10) Patent No.: US 12,784,825 B2
(45) Date of Patent: Nov. 3, 2026

(54) WORD LINE CHARGE PUMP CIRCUIT AND MEMORY DEVICE INCLUDING THE SAME

(71) Applicant: GLOBALFOUNDRIES U.S. Inc., Malta, NY (US)

(72) Inventors: Siva Kumar Chinthu, Bangalore (IN); P Sundar Veerendranath, Bangalore (IN)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 101 days.

(21) Appl. No.: 18/930,037

(22) Filed: Oct. 29, 2024

(65) Prior Publication Data

US 2026/0120762 A1 Apr. 30, 2026

(51) Int. Cl.
*G11C 13/00* (2006.01)
*G11C 5/14* (2006.01)

(52) U.S. Cl.
CPC .......... *G11C 13/0028* (2013.01); *G11C 5/145* (2013.01); *G11C 5/147* (2013.01); *G11C 13/0061* (2013.01)

(58) Field of Classification Search
CPC ..... G11C 13/0028; G11C 5/145; G11C 5/147; G11C 13/0061; G11C 13/0026; G11C 2013/0071; G11C 2213/79; G11C 8/08; G11C 13/003; G11C 13/0038; G11C 13/0069
USPC .............................................. 365/148, 189.05
See application file for complete search history.

(56) References Cited

U.S. PATENT DOCUMENTS 8,836,412 B2 9/2014 Wang et al.
9,640,246 B2 * 5/2017 Hong .................... G11C 11/419
2004/0125663 A1 * 7/2004 Pekny .................... G11C 5/145 365/189.11
2006/0077739 A1 * 4/2006 Pekny ...................... G11C 7/06 365/207
2011/0242912 A1 * 10/2011 Kang ..................... G11C 7/222 365/194
2013/0148438 A1 * 6/2013 Chen ........................ G11C 7/12 365/191
2022/0189541 A1 * 6/2022 Yang ..................... G11C 11/413
2022/0230678 A1 * 7/2022 Chakraborty ......... G11C 11/419
2022/0366993 A1 * 11/2022 Kim ....................... G11C 29/08

OTHER PUBLICATIONS

Mir Mohammad Navidi et al., A Regulated Charge Pump with Extremely Low Output Ripple, MDPI, Electronics 2019, doi:10.3390/electronics8111293, pp. 1-16, https://www.mdpi.com/2079-9292/8/11/1293.
Jung-woong Park et al., Charge Pump Regulation with Integrated 0.35 µm CMOS Control Circuit, Oct. 2012, pp. 391-394, International Symposium on Signals, Systems, and Electronics ISSSE, IEEE, 10.1109/ISSSE.2012.6374300.

* cited by examiner

*Primary Examiner* — Michael T Tran

(57) ABSTRACT

A word line charge pump circuit of a memory device includes a clock driver configured to drive a clock signal using a first voltage and output a buffered clock signal with a swing level corresponding to a level of the first voltage, and a charge pump configured to receive a bit line voltage and generate a word line voltage by boosting the bit line voltage using the buffered clock signal.

13 Claims, 5 Drawing Sheets

3

WORD LINE CHARGE PUMP CIRCUIT AND MEMORY DEVICE INCLUDING THE SAME

BACKGROUND

Semiconductor memory devices are widely used in various electronic devices such as cellular phones, digital cameras, personal digital assistants, mobile computing devices, and non-mobile computing devices. Among the semiconductor memory devices, a non-volatile memory device allows information to be stored and retained even when power is not supplied to the non-volatile memory device. A non-volatile memory device typically includes two-dimensional or three-dimensional arrays of non-volatile memory cells. The memory cells may be selected via control lines in X and Y directions. The control lines are driven by operating voltages.

Charge pumps are used in control line charge pump circuits that function as peripheral components in memory devices, producing various operating voltages, such as word line and bit line voltages, to drive the memory devices during various operations, from a lower power supply voltage. While several control line charge pump circuits utilizing charge pumps are known in the art, there is a need for improvements in their design, particularly in reducing current consumption, minimizing testing time required to determine trim codes, and decreasing the area occupied by the control line charge pump circuits.

SUMMARY

Embodiments of the present disclosure are directed to a word line charge pump circuit capable of generating a word line voltage by tracking a bit line voltage, and a memory device including the word line charge pump circuit.

In an embodiment, a word line charge pump circuit for a memory device includes: a clock driver configured to drive a clock signal using a first voltage and output a buffered clock signal with a swing level corresponding to a level of the first voltage; and a charge pump configured to receive a bit line voltage and generate a word line voltage by boosting the bit line voltage using the buffered clock signal.

In another embodiment, a memory device includes: a memory cell coupled between a bit line and a word line; a bit line charge pump circuit configured to generate a bit line voltage for driving the bit line; a word line charge pump circuit configured to receive the bit line voltage and generate a word line voltage for driving the word line by tracking the bit line voltage using a first voltage; and a low-dropout regulator configured to generate the first voltage based on an internal supply voltage of the memory device.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure provide a word line charge pump circuit capable of generating a word line voltage by tracking a bit line voltage using a low dropout voltage, and a memory device including the word line charge pump circuit.

Figure 1:
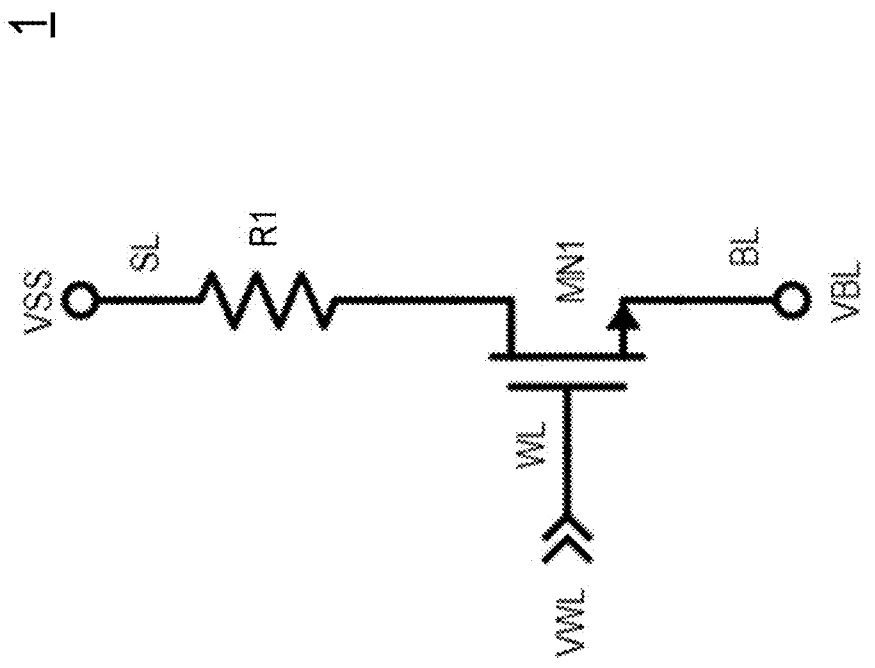
FIG. 1 illustrates a memory cell according to an embodiment.

FIG. 1 illustrates a memory cell 1 according to an embodiment.

The memory cell 1 is a resistive switching memory cell in a resistive random access memory (RRAM) device. The resistive switching memory cell includes a storage element and a switching element. In the resistive switching memory cell, the storage element includes a memristor R1, which stores binary data by varying its resistance. The switching element includes an NMOS transistor MN1, which controls access to the memristor R1 by turning on or off.

The NMOS transistor MN1 includes a gate, a source, and a drain. The gate is coupled to a word line WL, the source is coupled to a bit line BL. The drain is coupled to a first end of the memristor R1. A second end of the memristor R1 is coupled to a source line SL.

The word line WL is a control line that drives the gate of the NMOS transistor MN1 typically used to select the memory cell 1 for read, write, or erase operations. The source line SL is connected to a ground voltage terminal VSS, serving as a reference for the memristor R1. The bit line BL is responsible for sensing or writing data stored in the memristor R1 by applying a voltage or detecting current.

In a write operation to store data in the memristor R1, the word line WL is driven by a word line voltage VWL and the bit line BL is driven by a bit line voltage VBL, which controls the state of the NMOS transistor MN1. This either allows or blocks current flow between the bit line BL and the source line SL through the memristor R1. The resistance state of the memristor R1 can be set to either a high-resistance state or low-resistance state, depending on a voltage difference between the bit line BL and the source line SL. These resistance states represent binary values "1" or "0," based on whether the resistance of the memristor R1 is high or low.

In a read operation to read data stored in the memristor R1, the word line WL is driven by the word line voltage VWL, activating the NMOS transistor MN1. A small sensing current flows between the bit line BL and the source line SL. The current flowing through the memristor R1 is indicative of its resistance. This sensed current is used to determine whether the memristor R1 is in a high resistance state or low resistance state, thereby allowing the stored data (1 or 0) to be read.

In an erase operation, the memristor R1 is programmed to a low resistance state, representing "1." To program the memory cell 1, the word line voltage VWL is applied to the gate of the NMOS transistor MN1, activating it, while a reverse voltage is applied across the bit line BL and the source line SL. This reverse voltage aligns conductive filaments within the memory cell 1, transitioning it to a low resistance state. As a result, the memory cell 1 switches to the low resistance state, effectively erasing any previously stored data.

As described above, to perform operations on the memory cell 1, the word line voltage VWL is applied to the word line WL and the bit line voltage VBL is applied to the bit line BL. Since the word line voltage VWL is higher than the bit line voltage VBL, it is essential to maintain a stable level for the word line voltage VWL and to increase it rapidly.

Figure 2:
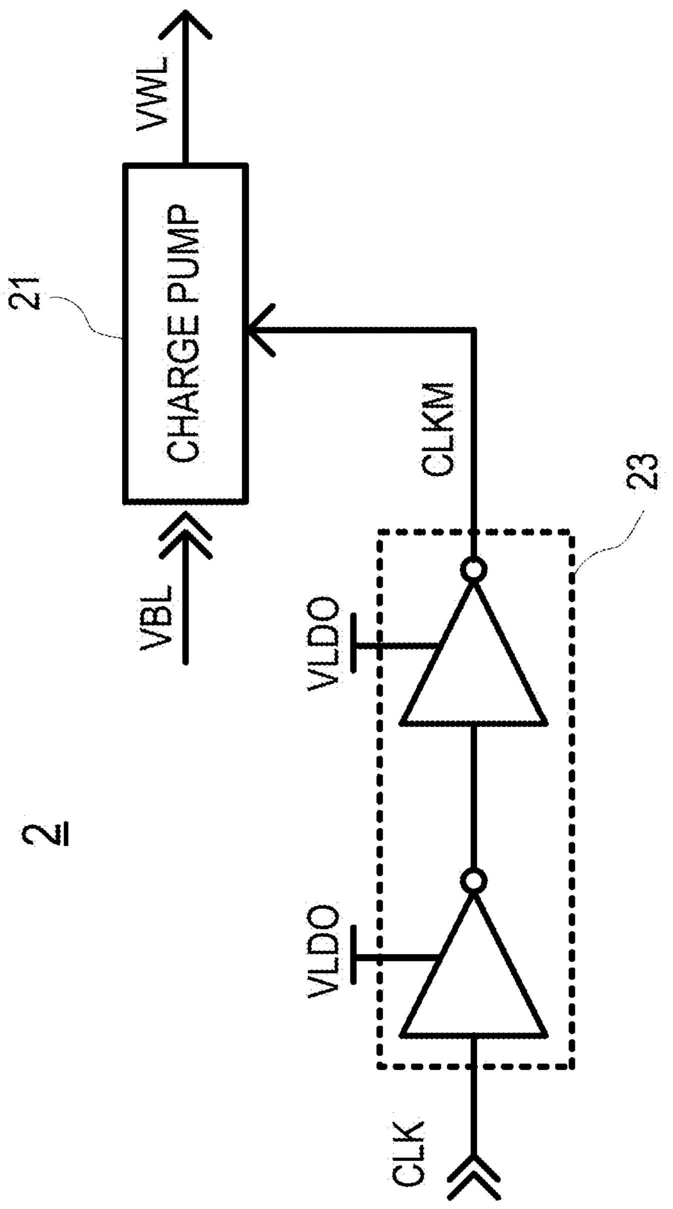
FIG. 2 illustrates a word line charge pump circuit according to an embodiment.

FIG. 2 illustrates a word line charge pump circuit 2 according to an embodiment. The word line charge pump circuit 2 is used in a memory device to generate a word line voltage VWL. The word line charge pump circuit 2 generates the word line voltage VWL by tracking a bit line voltage VBL. The word line charge pump circuit 2 includes a charge pump 21 and a clock driver 23.

The clock driver 23 drives a clock signal CLK based on a low-dropout voltage VLDO and output a buffered clock signal CLKM that has a swing level corresponding to the low-dropout voltage VLDO. The clock driver 23 may be implemented with multiple inverters. In this embodiment, the low-dropout voltage VLDO has a voltage level that corresponds to a difference between the word line voltage VWL and the bit line voltage VBL.

The charge pump 21 receives the bit line voltage VBL as input and raises a voltage level of the input bit line voltage VBL using the buffered clock signal CLKM to output the word line voltage VWL. Specifically, the word line voltage VWL is obtained by increasing the input bit line voltage VBL by the voltage level of the low-dropout voltage VLDO.

For example, when a required voltage level of the word line voltage VWL is 3.6V and the bit line voltage VBL is 2.4V, the clock driver 23 drives the clock signal CLK using the low-dropout voltage VLDO of 1.2V, which corresponds to the difference between the word line voltage VWL and the bit line voltage VBL. This generates the buffered clock signal CLKM with the swing level of 1.2V. The charge pump 21 then raises the bit line voltage VBL by 1.2V using the buffered clock signal CLKM, enabling the generation of the word line voltage VWL at the required voltage level of 3.6V.

In conventional technology, where a word line voltage and a bit line voltage are generated separately, a two-stage charge pump is used for the word line voltage VWL to raise its voltage level above that of the bit line voltage VBL, while a single-stage charge pump is implemented for the bit line voltage VBL.

In contrast, in this embodiment, since the word line voltage VWL is generated by tracking the bit line voltage VBL, the charge pump 21 can be implemented as a single-stage charge pump. Any single-stage charge pump can be used for the charge pump 21.

Figure 3:
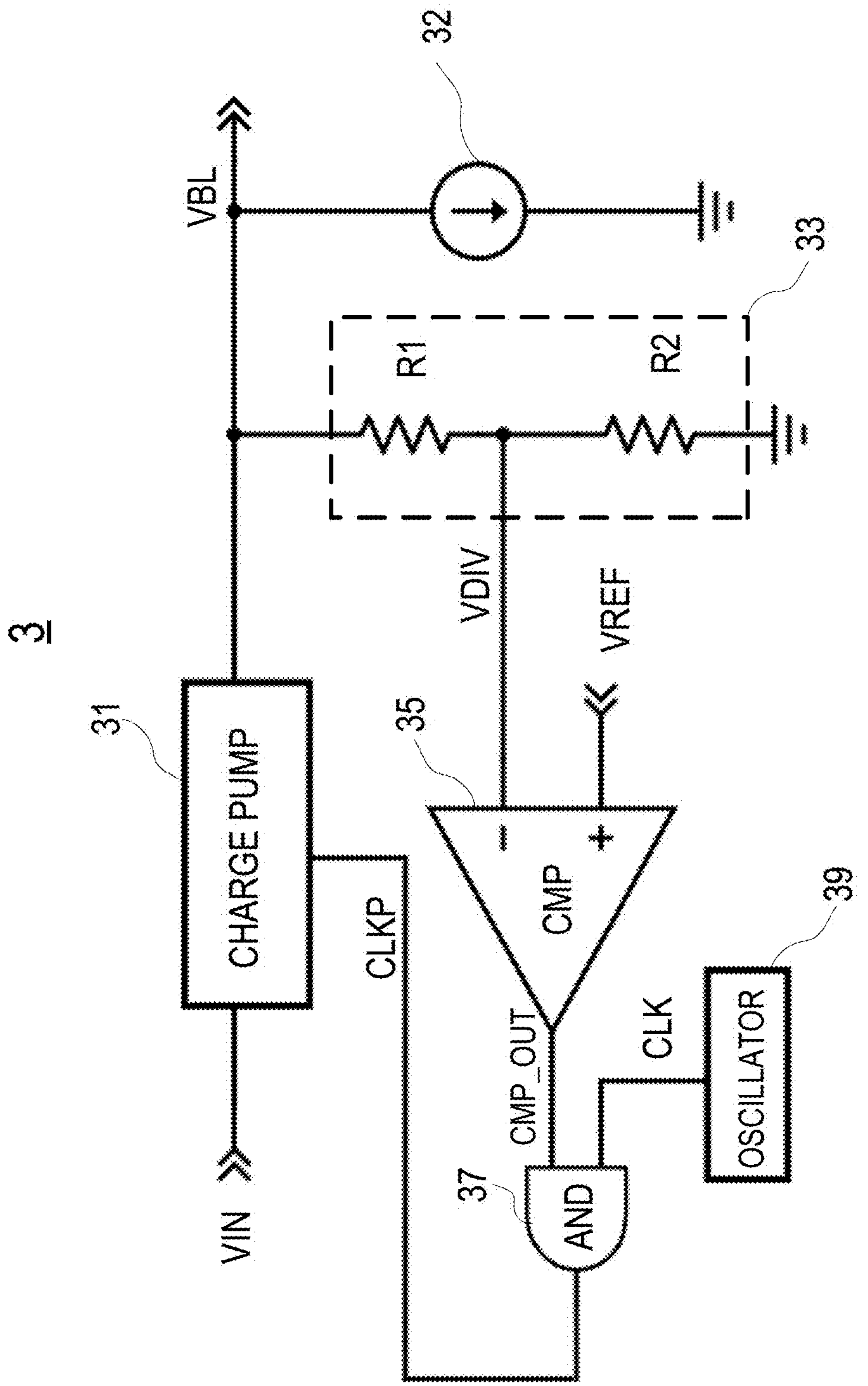
FIG. 3 illustrates a bit line charge pump circuit according to an embodiment.

FIG. 3 illustrates a bit line charge pump circuit 3 according to an embodiment. The bit line charge pump circuit 3 is used in a memory device to generate a bit line voltage VBL.

In this embodiment, the bit line voltage VBL is supplied to a bit line BL and is also input to the charge pump 21 of the word line charge pump circuit 2 illustrated in FIG. 2.

Referring to FIG. 3, the bit line charge pump circuit 3 has a closed loop system, and includes a charge pump 31, a current source 32, a voltage divider 33, a comparator (CMP) 35, an AND gate 37, and an oscillator 39.

The oscillator 39 generates a clock signal CLK. The voltage divider 33 divides a bit line voltage VBL by utilizing the resistance difference between a first resistor R1 and a second resistor R2 that are connected in series between a node of the bit line voltage VBL and ground. As a result, the voltage divider 33 generates a divided voltage VDIV, which has a reduced version of the bit line voltage VBL.

The comparator 35 compares the divided voltage VDIV with a reference voltage VREF and generates a comparison signal CMP_OUT. When the divided voltage VDIV is lower than the reference voltage VREF, the comparator 35 outputs a logic high value as the comparison signal CMP_OUT. Conversely, when the divided voltage VDIV is equal to or higher than the reference voltage VREF, the comparator 35 outputs a logic low value as the comparison signal CMP_OUT.

The AND gate 37 performs a logical AND operation on the comparison signal CMP_OUT and the clock signal CLK to generate a post-clock signal CLKP that is gated by the comparison signal CMP_OUT. When the comparison signal CMP_OUT is at a logic high value, the post-clock signal CLKP follows the clock signal CLK. Conversely, when the comparison signal CMP_OUT is at a logic low value, the post-clock signal CLKP is disabled and remains at a logic low level.

The charge pump 31 performs a charge pumping operation to generate the bit line voltage VBL in synchronization with the post-clock signal CLKP. When the post-clock signal CLKP follows the clock signal CLK, the charge pump 31 is activated to increase a voltage level of the bit line voltage VBL. However, when the post-clock signal CLKP remains at a logic low level, the charge pump 31 stops pumping the bit line voltage VBL, causing the voltage level of the bit line voltage VBL to drop.

For example, when the required voltage level of the bit line voltage VBL is 2.4V, the charge pump 31 receives an input voltage VIN, such as 1.8V, and incrementally boosts the input voltage VIN to output the bit line voltage VBL of 2.4V in synchronization with the clocking of the post-clock signal CLKP. After that, when the voltage level of the bit line voltage VBL reaches 2.4V, the charge pump 31 stops pumping, causing the voltage level of the bit line voltage VBL to drop in response to the post-clock signal CLKP remaining at a logic low level, as described above.

The current source 32 is used to regulate the bit line voltage VBL at a constant level.

Figure 4:
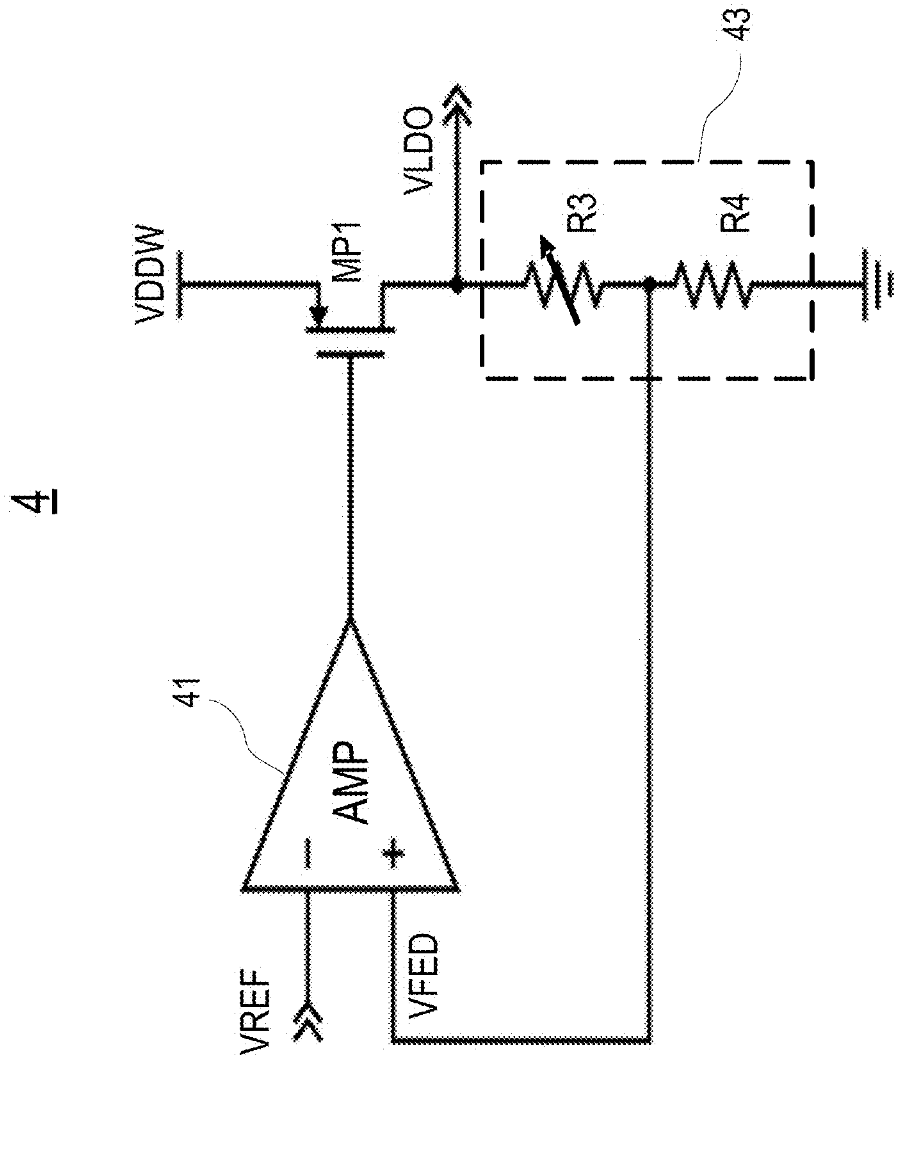
FIG. 4 illustrates a low-dropout regulator according to an embodiment.

FIG. 4 illustrates a low-dropout regulator 4 according to an embodiment. In this embodiment, the low-dropout regulator 4 generates a low-dropout voltage VLDO, which is used to produce the buffered clock signal CLKM in FIG. 2, by reducing a voltage level of an internal supply voltage VDDW. The low-dropout voltage VLDO may have a fixed voltage level.

The low-dropout regulator 4 includes a pass transistor MP1, an amplifier 41, and a feedback voltage divider 43. The pass transistor MP1 is typically a PMOS transistor. The amplifier (AMP) 41 is implemented using an operational amplifier.

The output current of the low-dropout regulator 4 is controlled by the PMOS transistor MP1, which is in turn regulated by the amplifier 41. The amplifier 41 compares a reference voltage VREF with a feedback voltage VFED output from the feedback voltage divider 43 and amplifies the voltage difference between the reference voltage VREF and the feedback voltage VFED.

When the feedback voltage VFED is lower than the reference voltage VREF, a gate of the PMOS transistor MP1 is pulled lower, allowing more current to pass and increasing a voltage level of an output voltage VLDO. Conversely, when the feedback voltage VFED is equal to or higher than the reference voltage VREF, the gate of the PMOS transistor MP1 is pulled higher, allowing less current to pass and decreasing the voltage level of the output voltage VLDO.

The feedback voltage divider 43 includes resistors R3 and R4 connected in series between an output terminal of the low-dropout regulator 4 and ground. The resistor R3 may be a variable resistor, allowing for adjustment of the feedback voltage VFED divided from the output voltage VLDO.

For example, when the word line charge pump circuit 2 in FIG. 2 boosts the bit line voltage VBL of 2.4V to generate the word line driving voltage VWL of 3.6V, the low-dropout regulator 4 outputs the output voltage VLDO of 1.2V as the supply voltage for the clock driver 23 in FIG. 2.

Figure 5:
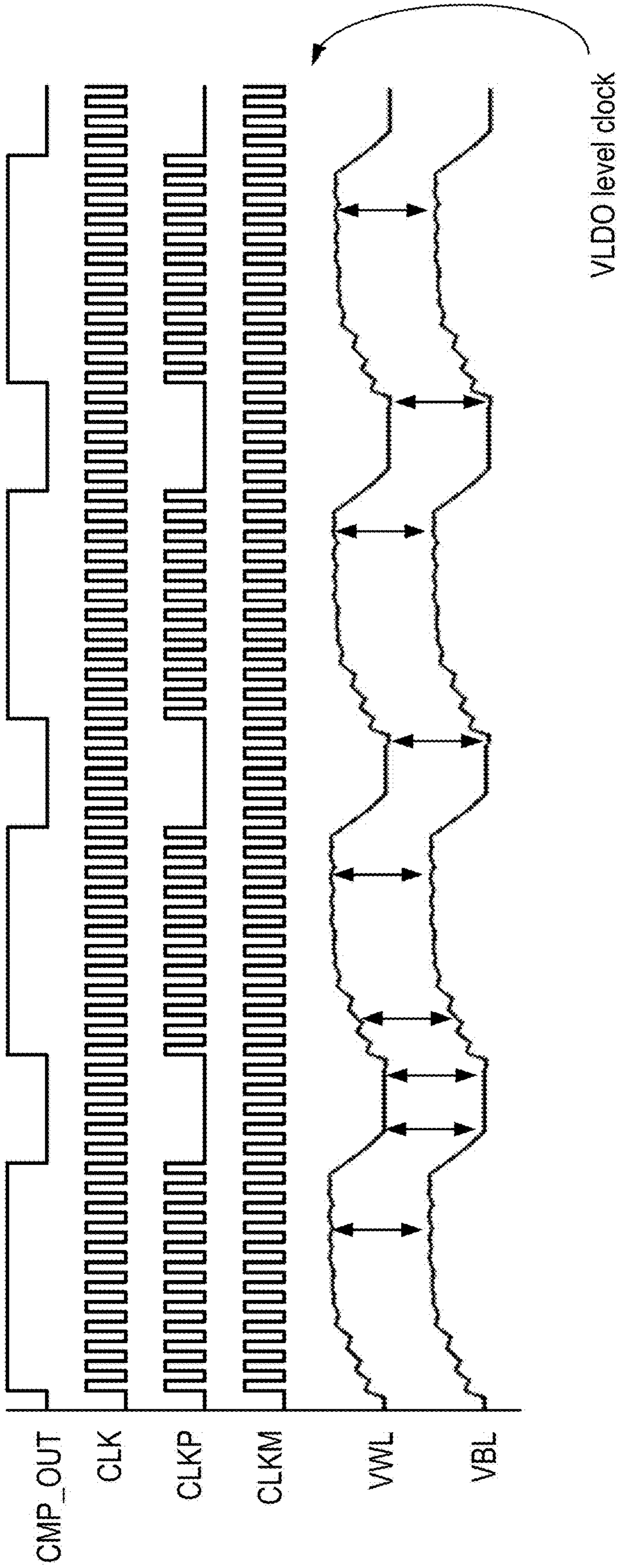
FIG. 5 is a timing diagram illustrating an operation of a memory device according to an embodiment.

FIG. 5 is a timing diagram illustrating an operation of a memory device according to an embodiment. The operation of the memory device shown in FIG. 5 will be described with reference to FIGS. 2 and 3.

Referring to FIG. 3, the oscillator 39 generates the clock signal CLK. The comparison signal CMP_OUT is produced by comparing the divided voltage VDIV, obtained by reducing the voltage level of the bit line voltage VBL, with the reference voltage VREF. The post-clock signal CLKP is generated through a logical AND operation on the comparison signal CMP_OUT and the clock signal CLK. The bit line voltage VBL is generated by incrementally pumping the input voltage VIN in synchronization with the post-clock signal CLKP.

As illustrated in FIG. 5, when the comparison signal CMP_OUT is at a logic high value, the post-clock signal CLKP follows the clock signal CLK. Accordingly, the bit line voltage VBL is incrementally boosted to the required voltage level. After that, when the bit line voltage VBL reaches the required voltage level, the divided voltage VDIV also transitions to equal or exceed the reference voltage VREF.

If the divided voltage VDIV equals or exceeds the reference voltage VREF, the comparison signal CMP_OUT changes to a logic low value, thereby disabling the post-clock signal CLKP to a logic low level.

When the post-clock signal CLKP is disabled to the logic low level, the charge pump 31 stops pumping the bit line voltage VBL, causing the bit line voltage VBL to begin to drop.

After that, when the bit line voltage VBL drops to a level that causes the divided voltage VDIV to fall below the reference voltage VREF, the comparison signal CMP_OUT transitions back to the logic high value. As a result, the post-clock signal CLKP follows the clock signal CLK again, prompting the charge pump 31 to increase the bit line voltage VBL in response to the post-clock signal CLKP.

The bit line charge pump circuit 3 illustrated in FIG. 3 repeatedly performs the aforementioned closed-loop operation to generate the bit line voltage VBL.

Referring to FIG. 2, the clock driver 23 generates the buffered clock signal CLKM by driving the clock signal CLK using the low-dropout voltage VLDO generated by the low-dropout regulator 4 illustrated in FIG. 4. The charge pump 21 generates the word line voltage VWL by tracking the input bit line voltage VBL based on the buffered clock signal CLKM.

As illustrated in FIG. 5, the buffered clock signal CLKM is generated by driving the clock signal CLK with the low-dropout voltage VLDO, which results in a swing level corresponding to the low-dropout voltage VLDO. The word line voltage VWL is obtained by increasing the input bit line voltage VBL by the voltage level of the low-dropout voltage VLDO.

Therefore, the level of the word line voltage VWL changes in response to the level of the bit line voltage VBL, while maintaining a constant voltage difference between them due to the fixed voltage VLDO. This relationship ensures that as the bit line voltage VBL fluctuates, the word line voltage VWL adjusts accordingly, ensuring consistent memory device operation and reliable performance.

In this embodiment, since the word line voltage VWL is generated by tracking the bit line voltage VBL, there is no need for a closed-loop control system to generate the word line voltage. This approach allows for consistent drive strength for a memory cell, such as memory cell 1 illustrated in FIG. 1.

Additionally, by generating the word line voltage VWL based on the bit line voltage VBL, the word line charge pump circuit can be implemented with a single-stage charge pump. This design simplifies the circuit, leading to several advantages: it reduces current consumption, minimizes the testing time required to determine trim codes for the word line charge pump and the bit line charge pump, and decreases the area occupied by the circuit, thereby enhancing overall efficiency of the memory device.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A word line charge pump circuit for a memory device, the circuit comprising:

a clock driver configured to drive a clock signal using a first voltage generated by a low-dropout regulator and output a buffered clock signal with a swing level corresponding to a level of the first voltage; and a charge pump configured to receive a bit line voltage generated by a bit line charge pump circuit and generate a word line voltage by boosting the bit line voltage using the buffered clock signal, wherein the word line voltage tracks the bit line voltage while maintaining a constant voltage difference determined by the first voltage.

2. The circuit of claim 1, wherein the charge pump includes a single-stage charge pump.

3. The circuit of claim 1, wherein the level of the first voltage corresponds to a voltage difference between the bit line voltage and the word line voltage that activates a memory cell of the memory device.

4. The circuit of claim 1, wherein the memory device is a resistive random access memory (RRAM) device.

5. The circuit of claim 1, wherein the clock driver includes multiple inverters and the first voltage is input to the multiple inverters as a supply voltage.

6. A memory device, comprising:

a memory cell coupled between a bit line and a word line;

a bit line charge pump circuit configured to generate a bit line voltage for driving the bit line;

a word line charge pump circuit configured to receive the bit line voltage and generate a word line voltage for driving the word line by tracking the bit line voltage using a first voltage; and a low-dropout regulator configured to generate the first voltage based on an internal supply voltage of the memory device.

7. The memory device of claim 6, wherein the word line charge pump circuit comprises:

a clock driver configured to drive a clock signal using the first voltage and output a buffered clock signal with a swing level corresponding to a level of the first voltage; and a charge pump configured to receive the bit line voltage and generate the word line voltage by boosting the bit line voltage based on the buffered clock signal.

8. The memory device of claim 7, wherein the charge pump includes a single-stage charge pump.

9. The memory device of claim 7, wherein the level of the first voltage corresponds to a voltage difference between the bit line voltage and the word line voltage that activates the memory cell.

10. The memory device of claim 7, wherein the memory device is a resistive random access memory (RRAM) device.

11. The memory device of claim 7, wherein the clock driver includes multiple inverters and the first voltage is input to the multiple inverters as a supply voltage.

12. The memory device of claim 6, wherein the bit line charge pump circuit comprises:

an oscillator configured to generate a clock signal;

a voltage divider configured to generate a divided voltage, which is a reduced version of the bit line voltage, by voltage-dividing the bit line voltage;

a comparator configured to compare the divided voltage with a reference voltage to generate a comparison signal;

a logical gate configured to perform a logical AND operation on the comparison signal and the clock signal, thereby generating a post-clock signal that is gated by the comparison signal; and a charge pump configured to perform a charge pumping operation on an input voltage to generate the bit line voltage in synchronization with the post-clock signal.

13. The memory device of claim 12, wherein the bit line charge pump circuit further comprises a current source configured to regulate a level of the bit line voltage.

* * * * *